United States Patent
Wong

(10) Patent No.: US 6,774,327 B1
(45) Date of Patent: Aug. 10, 2004

(54) HERMETIC SEALS FOR ELECTRONIC COMPONENTS

(75) Inventor: Marvin Glenn Wong, Woodland Park, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/671,188

(22) Filed: Sep. 24, 2003

(51) Int. Cl.[7] .............................................. H01L 21/30
(52) U.S. Cl. .................. 200/302.1; 200/182; 438/455; 29/622
(58) Field of Search .......................... 174/253; 200/182, 200/302.1; 438/455, 456

(56) References Cited

U.S. PATENT DOCUMENTS 6,323,447 B1  11/2001  Kondoh et al.
6,646,527 B1 * 11/2003  Dove et al. .................... 335/47
6,673,697 B2 *  1/2004  Ma et al. ..................... 438/455

* cited by examiner

Primary Examiner—Michael A. Friedhofer

(57) ABSTRACT

In a method of producing a plurality of hermetically sealed electronic components, first and second substrates are wafer bonded to enclose a plurality of electronic components therebetween. The first substrate is then cut to expose first seals on the first substrate and second seals on the second substrate. The first and second seals define perimeters around the plurality of electronic components. Solder is dispensed into the cuts in the first substrate, and the solder is then reflowed to join corresponding pairs of first and second seals.

22 Claims, 4 Drawing Sheets

2

HERMETIC SEALS FOR ELECTRONIC COMPONENTS

BACKGROUND OF THE INVENTION

It is desirable to hermetically seal electronic components (e.g., liquid metal micro-switches) in a format that is as small as possible in order to increase component and system reliability. Having as small a form factor as possible typically increases high frequency performance by reducing the parasitic capacitances and inductances in a system's circuitry. However, hermetically sealing small components has been difficult.

SUMMARY OF THE INVENTION

One aspect of the invention is embodied in a method for producing a plurality of hermetically sealed electronic components. The method comprises wafer bonding first and second substrates to enclose a plurality of electronic components therebetween. The first substrate is then cut to expose first seals on the first substrate and second seals on the second substrate. The first and second seals define perimeters around the plurality of electronic components. After cutting the first substrate, solder is dispensed into the cuts. The solder is then reflowed to join corresponding pairs of first and second seals.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
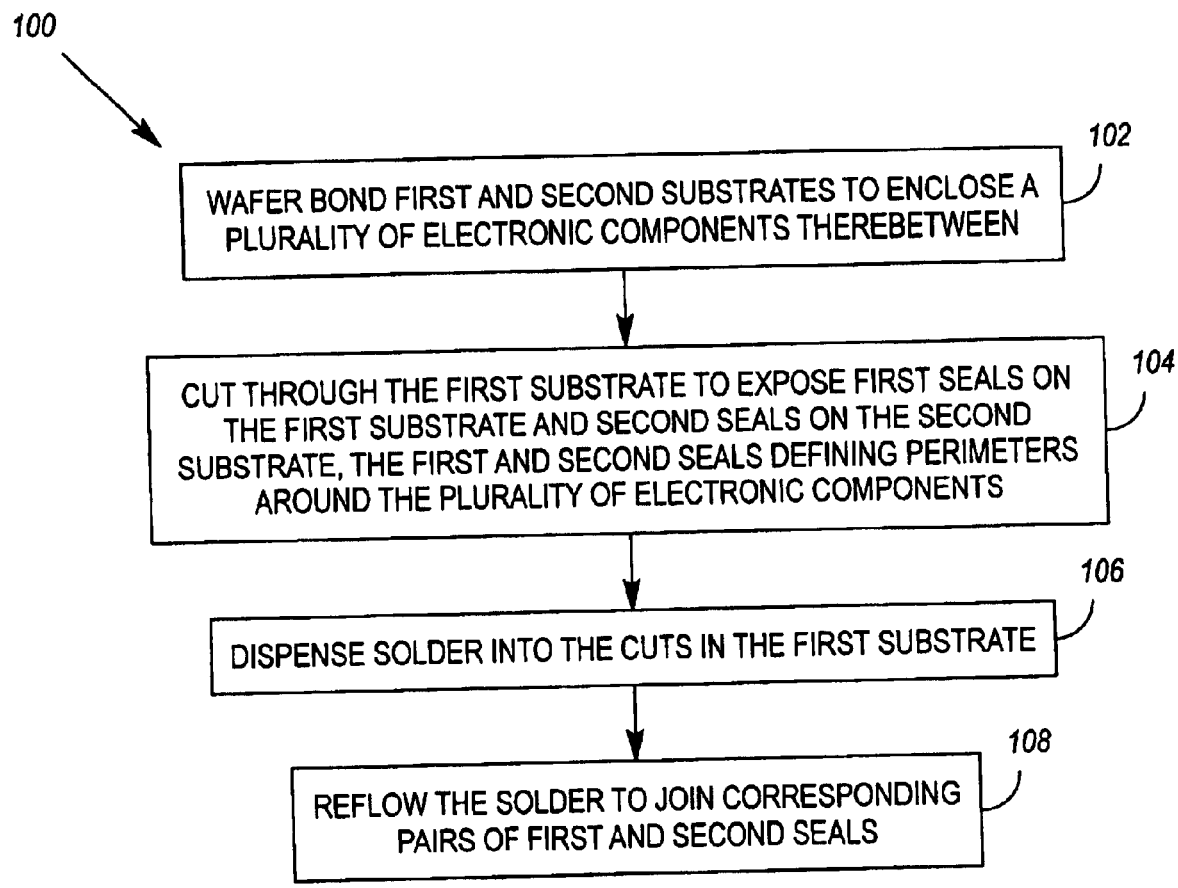
FIG. 1 illustrates an exemplary method for producing a plurality of hermetically sealed electronic components.

FIG. 1 illustrates a method 100 for producing a plurality of hermetically sealed electronic components. The method 100 comprises wafer bonding 102 first and second substrates to enclose a plurality of electronic components therebetween. The first substrate is then cut 104 to expose first seals on the first substrate and second seals on the second substrate. The first and second seals define perimeters around the plurality of electronic components. After exposing the seals, solder is dispensed 106 into the cuts in the first substrate. The solder is then reflowed 108 to join corresponding pairs of the first and second seals. Optionally, the second substrate is then cut to separate (or singulate) the electronic components.

Figure 2:
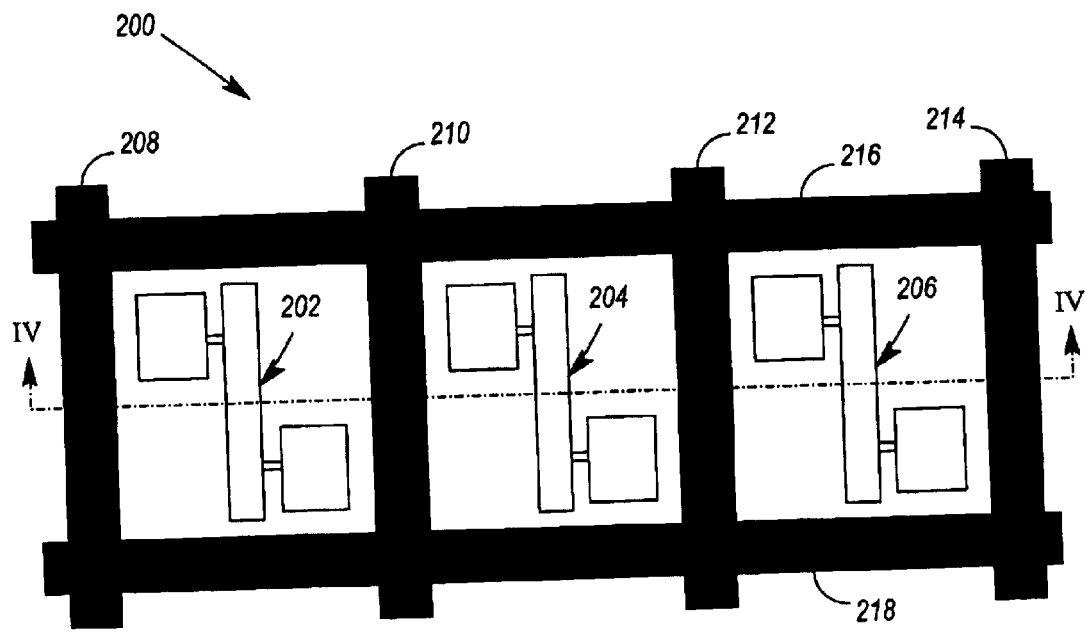
FIGS. 2 & 3 illustrate first and second substrates.

Referring now to FIGS. 2–9, an exemplary application of method 100 is illustrated. FIG. 2 illustrates a portion of a first substrate 200. By way of example, the substrate 200 is shown to have portions 202, 204, 206 of a plurality of electronic components formed therein or thereon. Also, by way of example, the portions 202–206 are shown to be channel structures for liquid micro-mechanical switches (LIMMS), such as those that are disclosed in U.S. Pat. No. 6,323,447 of Kondoh et al. entitled "Electrical Contact Breaker Switch, Integrated Electrical Contact Breaker Switch, and Electrical Contact Switching Method", and In U.S. patent application Ser. No. 10/137,691 of Marvin Glenn Wong filed May 2, 2002 and entitled "A Piezoelectrically Actuated Liquid Metal Switch", both of which are hereby incorporated by reference for all that they disclose.

Surrounding each of the electronic component portions 202–206 on the first substrate 200 are a number of seals 208, 210, 212, 214, 216, 218. These seals define the perimeters of the electronic component portions 202–206. As shown in FIG. 2, the seals 208–218 may form a continuous seal grid. Alternately, the seals 208–218 may form a number of distinct perimeter seals surrounding each of the electronic component portions 202–206.

Figure 3:
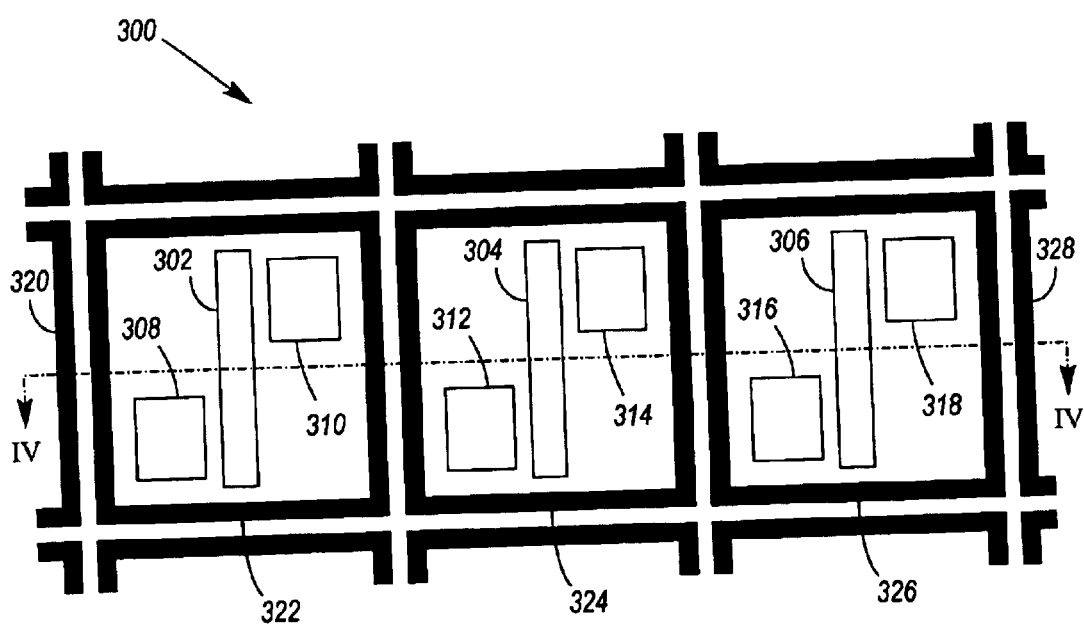

FIG. 3 illustrates a portion of a second substrate 300. By way of example, the substrate 300 is also shown to have portions 302, 304, 306, 308, 310, 312, 314, 316, 318 of a plurality of electronic components formed therein or thereon. Also, by way of example, the portions 302–318 are shown to be quantities of switching fluid 302–306 and actuating fluid 308–318 for a plurality of LIMMS.

Surrounding each of the electronic component portions 302–318 on the second substrate 300 are a number of seals 320, 322, 324, 326, 328. As shown in FIG. 3, the seals 322–326 preferably form distinct perimeter seals surrounding the electronic component portions 302–318. However, the seals 320–328 could also form a continuous seal grid as shown in FIG. 2.

It should be noted that the electronic component portions 202–206, 302–318 are exemplary only, and that alternate embodiments of the substrates 200, 300 may have more, fewer, or different components formed therein or thereon. It is also possible that only one or the other of the two substrates 200, 300 may have electronic components formed therein or thereon.

Figure 4:
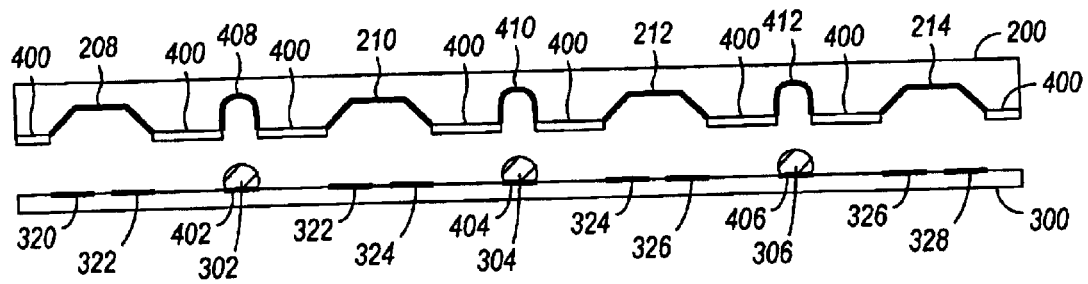
FIG. 4 illustrates cross-sections of the first and second substrates shown in FIGS. 2 & 3.
Figure 5:
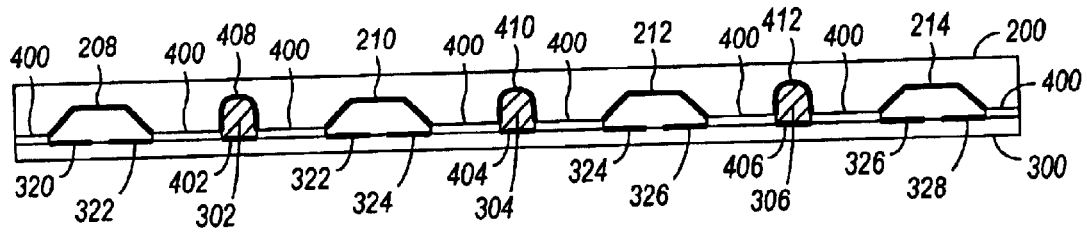
FIG. 5 illustrates the substrates of FIG. 4 after mating.
Figure 6:
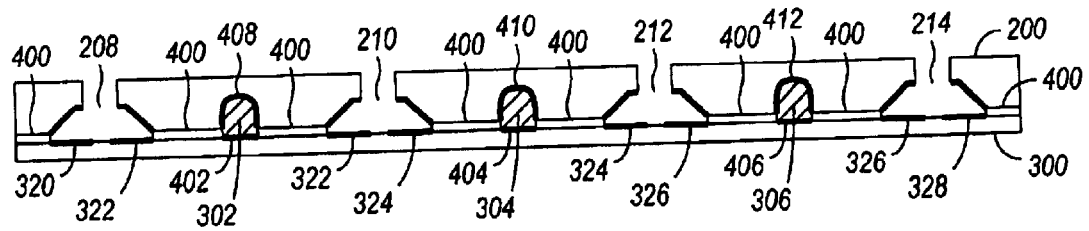
FIG. 6 illustrates the substrates of FIG. 5 after cutting of the first substrate.

FIG. 4 illustrates cross-sections of the substrates shown in FIGS. 2 & 3, as the two substrates 200, 300 are positioned for wafer bonding. By way of example, an adhesive 400 may be used to bond the two substrates. One exemplary adhesive that may be used for this purpose is Cytop™ (manufactured by Asahi Glass Co., Ltd. of Tokyo, Japan).

As further shown in FIG. 4, the switching fluids 302–306 carried by substrate 300 may bet wetted to metallic pads 402, 404, 406, and the channels formed in the substrate 200 may be lined with metallic coatings 408, 410, 412. As the two substrates 200, 300 are brought together (FIG. 5), the switching fluids 302–306 wet to the metallic coatings 408–412 and are confined within the channels formed in the substrate 200.

Subsequent to bonding the substrates 200, 300, the substrate 200 is cut as needed (FIG. 6), and likely in a grid formation, to expose the first and second seals 208–214, 320–328. This may be done by sawing through the substrate 200 at a controlled depth or, alternately, laser cutting or otherwise cutting through the substrate 200.

Figure 7:
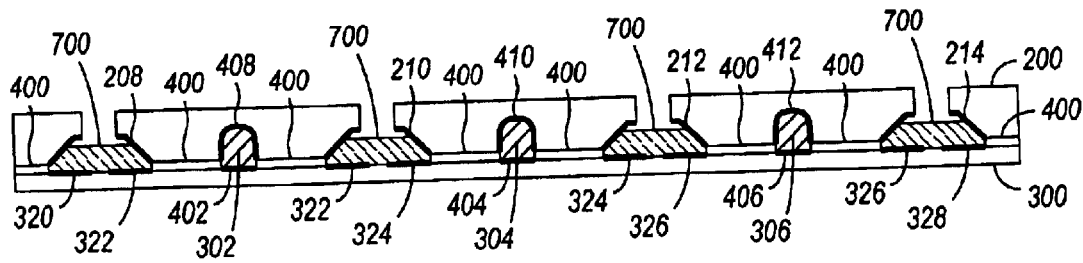
FIG. 7 illustrates the substrates of FIG. 6 after solder has been dispensed in the cuts in the first substrate.

As shown in FIG. 7, solder 700 is dispensed into the cuts in the substrate 200. The solder may take the form of a paste, wherein the solder is mixed with flux. After being dispensed into the cuts of the substrate 200, the solder is reflowed (FIG.

Figure 8:
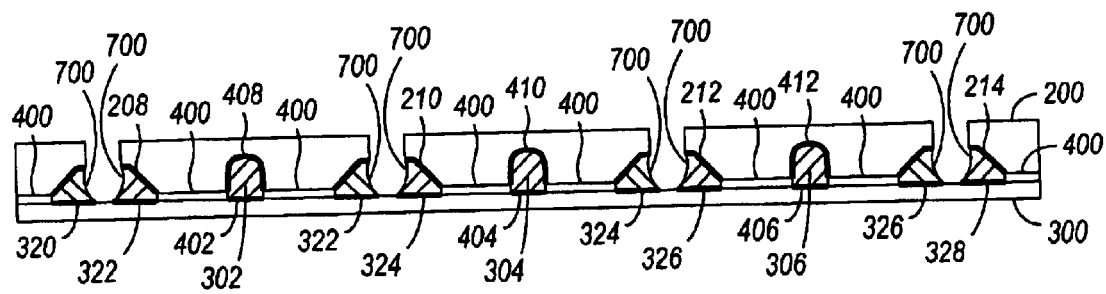
FIG. 8 illustrates the substrates of FIG. 7 after the solder has been reflowed.

8) to join corresponding pairs of seals (e.g., seals 208 and 320) in the substrates 200, 300. If the seals 208–214, 320–328 are wettable by the solder 700, then as shown in FIG. 8, the solder 700 should wick into the joint of two corresponding seals (i.e., where the two seals meet, or where the two seals come closest to meeting one another).

As shown in FIGS. 4–8, the seals 208–214 on the upper substrate 200 may be formed in channels that are shaped to aid in drawing reflowed solder into a joint. In FIGS. 4–8, the channels in which the upper seals 208–214 are formed are provided with tapered walls and/or have a trapezoidal cross-section. Alternately, the channels could have a circular or other cross-section. By forming the upper seals 208–214 in channels, larger cavities are formed for receiving solder between corresponding upper and lower seals (e.g., seals 208 and 320). Then, so long as the upper seal is wettable by the solder, and the quantity of solder 700 dispensed into a cavity is sufficient to contact at least a portion of the upper seal, reflowing the solder will allow the solder to wick upwards on (or climb) the upper seal to form an acceptable joint between a set of corresponding upper and lower seals. Also, by shaping a cavity/wettable seals as described, the hermetic sealing process shown in FIG. 1 is less sensitive to solder volume.

Figure 9:
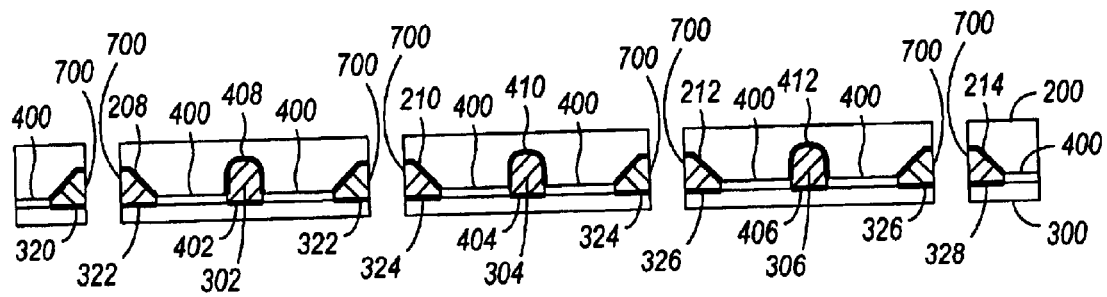
FIG. 9 illustrates singulated electronic components cut from the FIG. 8 substrates.

Seals 320–328 on a lower substrate 300 may also be variously shaped (and may be formed in channels), but need not be. It is, however, useful to provide a gap between adjacent lower seals (e.g., seals 320 and 322). If the surface of the gap is made to be unwettable by solder 700, then the gap is likely to be preserved after the solder 700 is reflowed. In some cases, creation and preservation of the gap aids in later separation (or singulation; FIG. 9) of electronic components that have been hermetically sealed via the above method(s). In one embodiment, electronic components are separated by cutting through the substrate 300 in the same manner that the substrate 200 is cut.

At some point prior to reflowing the solder 700, it may be desirable to deposit solder balls on one or both of the substrates 100, 200. As is known in the art, solder balls may be used to electrically couple a packaged electronic component to the outside world, or to mechanically couple a package to another substrate or device. If solder balls are deposited on one or both of the substrates 100, 200 prior to reflowing the solder 700, then these solder balls may be heated in the same step to thereby secure them to the substrates 100 or 200.

Although the above methods and apparatus have been presented in the context of hermetically sealing a plurality of electronic components, the methods and apparatus apply equally to the formation of a single hermetically sealed electronic component. However, wafer bonding two substrates to form a plurality of electronic components can be advantageous in that allows a plurality of electronic components to be formed in a single alignment and processing step, thus greatly increasing throughput.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for producing a plurality of hermetically sealed electronic components, comprising:

wafer bonding first and second substrates to enclose a plurality of electronic components therebetween;

cutting through the first substrate to expose first seals on the first substrate and second seals on the second substrate, the first and second seals defining perimeters around the plurality of electronic components;

dispensing solder into the cuts in the first substrate; and reflowing the solder to join corresponding pairs of the first and second seals.

2. The method of claim 1, further comprising, prior to reflowing the solder, depositing solder balls on one of the substrates, the solder balls being electrically coupled to the electronic components.

3. The method of claim 1, further comprising, subsequent to reflowing the solder paste, cutting through the second substrate to separate the plurality of electronic components.

4. The method of claim 1, further comprising, prior to said wafer bonding:

forming channels in the first substrate; and forming said first seals in said channels.

5. The method of claim 4, wherein the channels have tapered walls.

6. The method of claim 4, wherein the channels have trapezoidal cross-sections.

7. The method of claim 4, wherein the channels have circular cross-sections.

8. The method of claim 1, wherein the first and second substrates are bonded using Cytop™.

9. A hermetically sealed electronic component, produced by:

wafer bonding first and second substrates to enclose the electronic component therebetween;

cutting through the first substrate to expose a first seal on the first substrate and a second seal on the second substrate, the first and second seals defining a perimeter of the electronic component;

dispensing solder paste into the cuts in the first substrate; and reflowing the solder paste to join the first and second seals.

10. The hermetically sealed electronic component of claim 9, further produced by, prior to reflowing the solder paste, depositing solder balls on one of the substrates, the solder balls being electrically coupled to the electronic component.

11. The hermetically sealed electronic component of claim 9, further produced by, subsequent to reflowing the solder paste, cutting through the second substrate to singulate the electronic component.

12. The hermetically sealed electronic component of claim 9, further produced by:

forming channels in the first substrate; and forming said first seals in said channels.

13. The hermetically sealed electronic component of claim 12, wherein the channels have tapered walls.

14. The hermetically sealed electronic component of claim 12, wherein the channels have trapezoidal cross-sections.

15. The hermetically sealed electronic component of claim 12, wherein the channels have circular cross-sections.

16. The hermetically sealed electronic component of claim 9, wherein the first and second substrates are bonded using Cytop™.

17. Hermetically sealed electronic components, comprising:

a plurality of said electronic components;

a first wafer having a plurality of first seals around the perimeters of the electronic components; the first wafer being segmented by a plurality of cuts between the electronic components;

a second wafer, bonded to the first to enclose the plurality of electronic components therebetween; the second wafer having a plurality of second seals corresponding to the first seals; and solder joining corresponding ones of the first and second seals.

18. The hermetically sealed electronic components of claim 17, further comprising channels in the first substrate; the first seals being formed in said channels.

19. The hermetically sealed electronic components of claim 18, wherein the channels have tapered walls.

20. The hermetically sealed electronic components of claim 18, wherein the channels have trapezoidal cross-sections.

21. The hermetically sealed electronic components of claim 18, wherein the channels have circular cross-sections.

22. The hermetically sealed electronic components of claim 18, wherein the first and second substrates are bonded using Cytop™.

* * * * *